(12) United States Patent
Yue et al.

(10) Patent No.: US 7,430,496 B2
(45) Date of Patent: Sep. 30, 2008

(54) METHOD AND APPARATUS FOR USING A PRESSURE CONTROL SYSTEM TO MONITOR A PLASMA PROCESSING SYSTEM

(75) Inventors: Hongyu Yue, Plano, TX (US); Hieu A Lam, Richardson, TX (US)

(73) Assignee: Tokyo Electron Limited (JP)

( * ) Notice: Subject to any disclaimer, the term of this patent is extended or adjusted under 35 U.S.C. 154(b) by 189 days.

(21) Appl. No.: 10/868,346

(22) Filed: Jun. 16, 2004

(65) Prior Publication Data

US 2005/0283321 A1 Dec. 22, 2005

(51) Int. Cl.
*G06F 11/30* (2006.01)
*G21C 17/00* (2006.01)

(52) U.S. Cl. ..................................................... 702/185

(58) Field of Classification Search .................. 702/30, 702/33
See application file for complete search history.

(56) References Cited

U.S. PATENT DOCUMENTS

| 5,311,452 | A | 5/1994 | Yokota et al. | |
| 6,265,231 | B1 | 7/2001 | Walters | |
| 6,843,264 | B2 * | 1/2005 | Chang et al. | ................... 137/14 |
| 7,217,942 | B2 * | 5/2007 | Tanaka | ....................... 250/554 |
| 2002/0182878 | A1 | 12/2002 | Hirose et al. | |
| 2005/0115824 | A1 * | 6/2005 | Donohue et al. | ........ 204/192.12 |
| 2006/0048891 | A1 * | 3/2006 | Yue et al. | ................ 156/345.25 |

* cited by examiner

*Primary Examiner*—Michael P Nghiem

(57) ABSTRACT

A method and apparatus is presented for using a pressure control system to monitor a plasma processing system. By monitoring variations in the state of the pressure control system, a fault condition, an erroneous fault condition, or a service condition can be detected. For example, the service condition can include monitoring the accumulation of residue between successive preventative maintenance events.

9 Claims, 7 Drawing Sheets

METHOD AND APPARATUS FOR USING A PRESSURE CONTROL SYSTEM TO MONITOR A PLASMA PROCESSING SYSTEM

BACKGROUND OF THE INVENTION

1. Field of the Invention

The present invention relates to a method of monitoring the status of a plasma processing system and, more particularly, to a method and system for monitoring the status of a plasma processing system using a pressure control system.

2. Description of Related Art

The fabrication of integrated circuits (IC) in the semiconductor industry typically employs plasma to create and assist surface chemistry within a plasma processing system necessary to remove material from and deposit material to a substrate. In general, plasma is formed within the plasma processing system under vacuum conditions by heating electrons to energies sufficient to sustain ionizing collisions with a supplied process gas. Moreover, the heated electrons can have energy sufficient to sustain dissociative collisions, and therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate).

The processes described above are sensitive to the conditions achieved within the plasma processing system and, in order to meet expected yields, precise control of these conditions is now required. For example, changes in these conditions due to either abrupt changes (or faults), or gradual changes require constant monitoring. Therefore, it is of increasing importance to detect fault conditions, determine whether the fault is real or erroneous, and determine if a service condition is present.

SUMMARY OF THE INVENTION

One aspect of the invention is to reduce or eliminate any or all of the above-described problems.

Another object of the invention is to provide a method and apparatus for monitoring the status of a plasma processing system.

Another object of the invention is to provide a method and apparatus for monitoring the status of a plasma processing system using a pressure control system.

Another object of the invention is to provide a method and apparatus for detecting at least one of a fault or an erroneous fault in a plasma processing system using a pressure control system.

Another object of the invention is to provide a method and apparatus for determining a condition for cleaning a plasma processing system.

According to yet another aspect of the invention, a method of determining a status for a plasma processing system is described, which includes executing a process in the plasma processing system, monitoring a pressure control system coupled to the plasma processing system and configured to control the pressure of the process in the plasma processing system, and determining at least one of a fault condition, an erroneous fault condition, or a service condition for the plasma processing system from the monitoring.

According to yet another aspect of the invention, a plasma processing system is described that includes a process chamber, a plasma source coupled to the process chamber and configured to form a plasma in the process chamber, a substrate holder coupled to the process chamber and configured to support a substrate, a gas injection system coupled to the process chamber and configured to introduce a process gas, a pressure control system coupled to the process chamber and configured to control a pressure in the process chamber, and a controller coupled to the plasma processing system and configured to monitor the pressure control system and determine at least one of a fault condition, an erroneous fault condition, or a service condition for the plasma processing system from the monitoring.

Other aspects of the invention will be made apparent by the description that follows and by the drawings appended hereto.

BRIEF DESCRIPTION OF THE DRAWINGS

The drawings depict representative embodiments of the invention. Where appropriate, like reference numerals are relied upon to designate like features, in which.

DETAILED DESCRIPTION OF EXEMPLARY EMBODIMENTS

In the following description, to facilitate a thorough understanding of the invention and for purposes of explanation and not limitation, specific details are set forth, such as a particular geometry of the plasma processing system and various descriptions of the pressure control system. However, it should be understood that the invention may be practiced with other embodiments that depart from these specific details.

Nonetheless, it should be appreciated that, contained within the description are features which, notwithstanding the inventive nature of the general concepts being explained, are also of an inventive nature.

Figure 1:
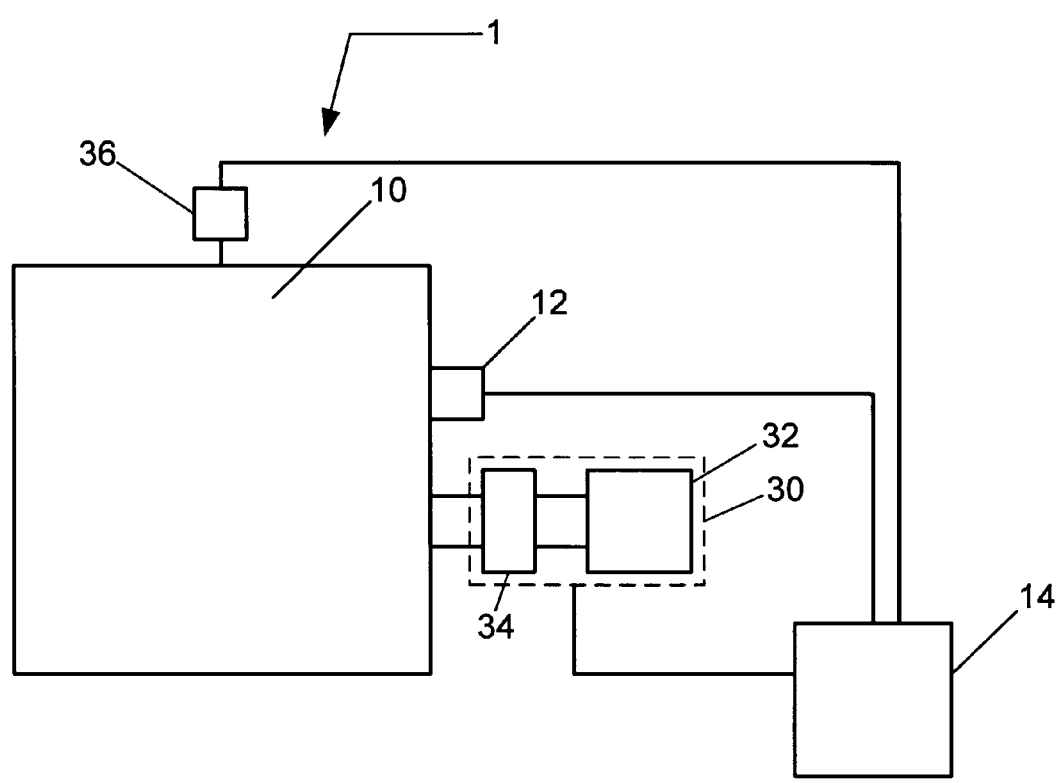
FIG. 1 is a simplified schematic diagram of a plasma processing system according to an embodiment of the invention.

Referring now to FIG. 1, a plasma processing system is presented for performing an etching or deposition process. For example, as shown in FIG. 1, an exemplary plasma processing system 1 includes a plasma processing chamber 10, a diagnostic system 12 coupled to the plasma processing chamber 10, and a controller 14 coupled to the diagnostic system 12 and the plasma processing chamber 10. Additionally, the plasma processing system 1 comprises a pressure control system 30 including a pumping system 32 and a valve 34. The plasma processing system also includes a gas injection system 36. In the embodiment illustrated, the gas injection system 36 is shown as a component separate from the pressure control system 30. As would be appreciated by those skilled in the art, however, in one possible variant, the gas injection system 36 may be incorporated as a part of the pressure control system 30 without departing from the scope of the invention.

The controller 14 is configured to execute a process recipe including an etching process. Additionally, the controller 14 is configured to receive at least one signal from the diagnostic system 12 and to post-process the at least one signal in order to accurately determine a status for the process, such as a pressure of the process. In the illustrated embodiment, the plasma processing system 1, depicted in FIG. 1, utilizes a plasma for material processing. The plasma processing system 1 may include an etch chamber, or a deposition chamber in other contemplated variants of the invention.

Additionally, the pressure control system 30 is configured to perform at least one of adjusting and controlling the pressure in the plasma processing system 1, utilizing at least one of the pumping system 32 or the valve 34. Furthermore, the gas injection system 36 is configured to introduce a process gas at a flow rate and to adjust or control the pressure in the plasma processing system 1 in combination with the pressure control system 30.

Figure 2:
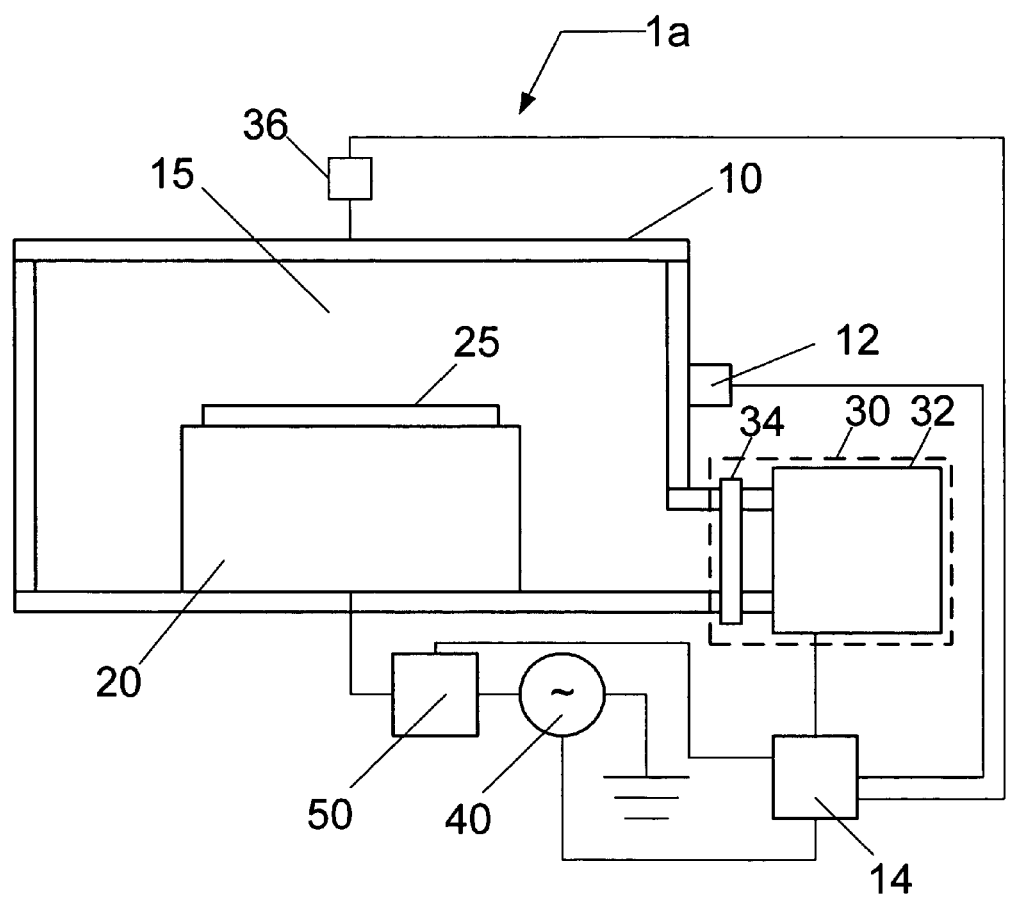
FIG. 2 is a schematic diagram of a plasma processing system according to another embodiment of the invention.

According to the embodiment depicted in FIG. 2, a plasma processing system 1a in accordance with the present invention may include the plasma processing chamber 10, a substrate holder 20, upon which a substrate 25 to be processed is affixed, and the pressure control system 30. The substrate 25 may be, for example, a semiconductor substrate, a wafer or a liquid crystal display (LCD). The plasma processing chamber 10 may be, for example, configured to facilitate the generation of plasma in processing region 15 adjacent a surface of the substrate 25. An ionizable gas or mixture of gases is introduced via the gas injection system 36 (such as a gas injection pipe, or gas injection showerhead) and the process pressure is adjusted using the pressure control system 30. Plasma can be utilized to create materials specific to a predetermined materials process, and/or to aid the removal of material from the exposed surfaces of the substrate 25. The plasma processing system 1a may be configured to process 200 mm substrates, 300 mm substrates, or larger-sized substrates. In fact, it is contemplated that either (or both) of the plasma processing system 1, 1a may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The substrate 25 can be, for example, affixed to the substrate holder 20 via an electrostatic clamping system. Furthermore, the substrate holder 20 may, for example, further include a cooling system including a re-circulating coolant flow that receives heat from the substrate holder 20 and transfers heat to a heat exchanger system (not shown), or when heating, transfers heat from the heat exchanger system. Moreover, gas can, for example, be delivered to the back-side of the substrate 25 via a backside gas system to improve the gas-gap thermal conductance between the substrate 25 and the substrate holder 20. Such a system may be utilized when temperature control of the substrate is required at elevated or reduced temperatures. For example, the backside gas system may include a two-zone gas distribution system, wherein the helium gas gap pressure can be independently varied between the center and the edge of the substrate 25. In other embodiments, heating/cooling elements, such as resistive heating elements, or thermo-electric heaters/coolers may be included in the substrate holder 20, as well as the chamber wall of the plasma processing chamber 10, and any other component within the plasma processing system 1a.

In the embodiment shown in FIG. 2, the substrate holder 20 may include an electrode through which RF power is coupled to the processing plasma in the process space 15. For example, the substrate holder 20 may be electrically biased at a RF voltage via the transmission of RF power from a RF generator 40 through an impedance match network 50 to substrate holder 20. The RF bias may serve to heat electrons to form and maintain a plasma. In this configuration, the system 1a may operate as a reactive ion etch (RIE) reactor, wherein the chamber 10 and an upper gas injection electrode serve as ground surfaces. A typical frequency for the RF bias may range from 0.1 MHz to 100 MHz. RF systems for plasma processing are well known to those skilled in the art.

Alternately, RF power may be applied to the substrate holder electrode at multiple frequencies. Furthermore, the impedance match network 50 serves to improve the transfer of RF power to the plasma in the plasma processing chamber 10 by reducing the reflected power. Match network topologies (e.g., L-type, π-type, T-type, etc.) and automatic control methods are well known to those skilled in the art and are, therefore, not described further.

The pressure control system 30 includes the pumping system 32 and the valve 34. The pumping system 32 may include, for example, a turbo-molecular vacuum pump (TMP) capable of a pumping speed up to 10000 liters per second (and greater). The valve 34 may include, for example, a gate valve, a swing gate valve, or a butterfly valve. Furthermore, the diagnostic system 12, including a device for monitoring chamber pressure, may be coupled to the plasma processing chamber 10. The pressure measuring device may be, for example, a Type 628B Baratron absolute capacitance manometer commercially available from MKS Instruments, Inc. (Andover, Mass.).

The controller 14 preferably includes a microprocessor, memory, and a digital I/O port capable of generating control voltages sufficient to communicate and activate inputs to the plasma processing system 1a as well as monitor outputs from the plasma processing system 1a. Moreover, the controller 14 may be coupled to and may exchange information with the RF generator 40, the impedance match network 50, the gas injection system (not shown), the pressure control system 30, the diagnostic system 12, as well as the backside gas delivery system (not shown), the substrate/substrate holder temperature measurement system (not shown), and/or the electrostatic clamping system (not shown). For example, a program stored in the memory may be utilized to activate the inputs to the aforementioned components of the plasma processing system 1a according to a process recipe in order to perform an etching process. One example of the controller 14 is a DELL PRECISION WORKSTATION 610™, available from Dell Corporation, Austin, Tex.

The controller 14 may be locally located relative to the plasma processing system 1a, or it may be remotely located relative to the plasma processing system 1a. For example, the controller 14 may exchange data with the plasma processing system 1a using at least one of a direct connection, an intranet, the Internet and a wireless connection. The controller 14 may be coupled to an intranet at, for example, a customer site; (i.e., a device maker, etc.), or it may be coupled to an intranet at, for example, a vendor site (i.e., an equipment manufacturer). Additionally, for example, the controller 14 may be coupled to the Internet. Furthermore, another computer (i.e., controller, server, etc.) may access, for example, the controller 14 to exchange data via at least one of a direct connection, an intranet, and the Internet. As also would be appreciated by those skilled in the art, the controller 14 may exchange data with the plasma processing system 1a via a wireless connection.

Figure 3:
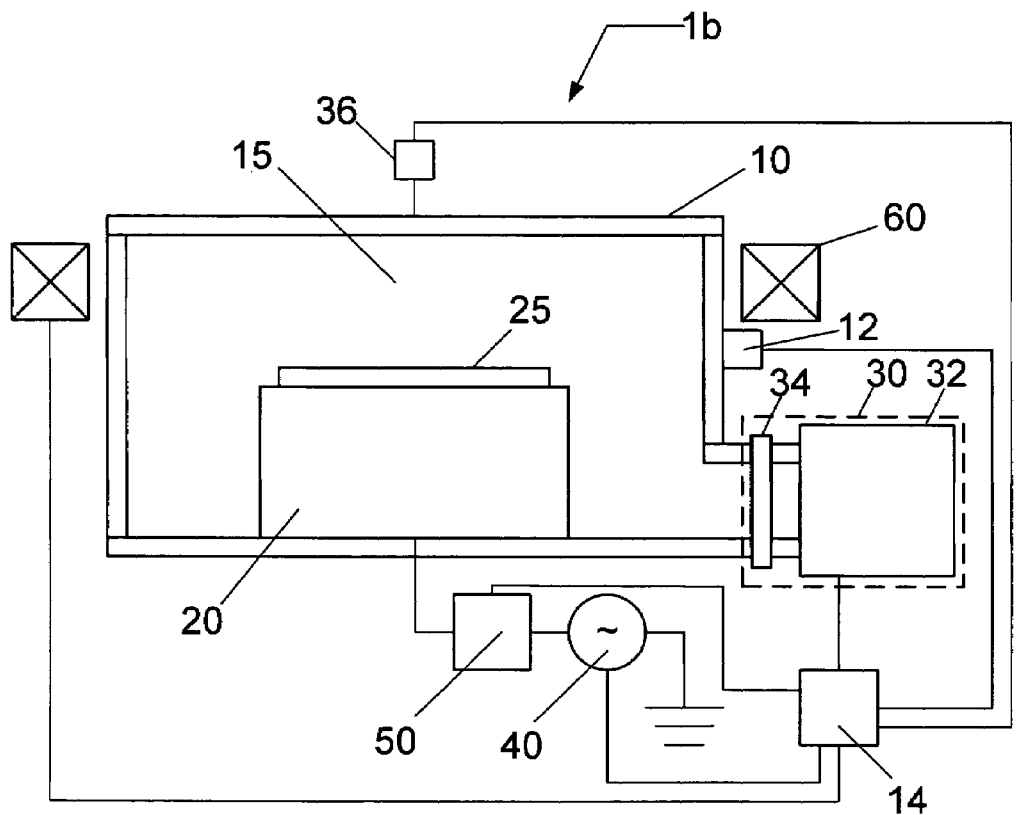
FIG. 3 is a schematic diagram of a plasma processing system according to still another embodiment of the invention.

In the embodiment shown in FIG. 3, a plasma processing system 1b that may be used to implement the present invention may, for example, be similar to the embodiment of FIG. 1 or 2 and further include either a stationary or a mechanically or electrically rotating magnetic field system 60, in order to potentially increase plasma density and/or improve plasma processing uniformity, in addition to those components described with reference to FIG. 1 and FIG. 2. Moreover, the controller 14 may be coupled to the magnetic field system 60 in order to regulate the speed of rotation and field strength. The design and implementation of a rotating magnetic field is well known to those skilled in the art.

Figure 4:
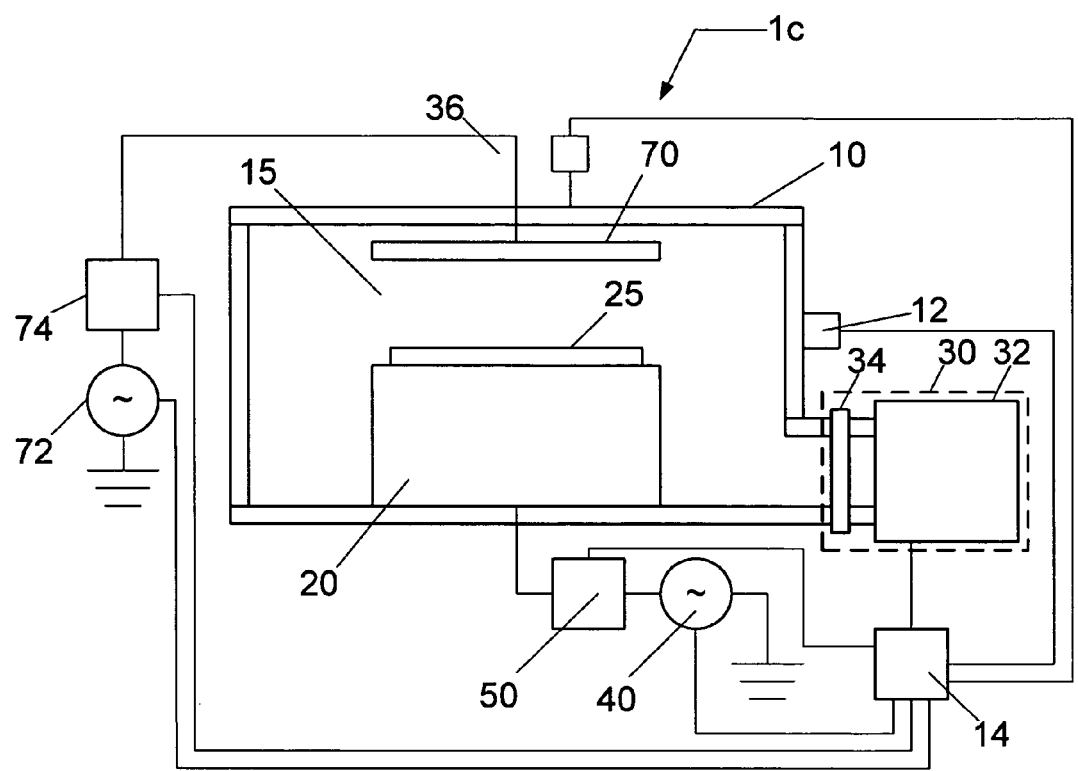
FIG. 4 is a schematic diagram of a plasma processing system according to yet another embodiment of the invention.

In the embodiment shown in FIG. 4, a plasma processing system 1c that may be used to implement the present invention may, for example, be similar to the embodiment of FIG. 1 or FIG. 2, and may further include an upper electrode 70 to which RF power may be coupled from a RF generator 72 through an impedance match network 74. A typical frequency for the application of RF power to the upper electrode 70 may range from 0.1 MHz to 200 MHz. Additionally, a typical frequency for the application of power to the lower electrode may range from 0.1 MHz to 100 MHz. Moreover, the controller 14 is coupled to RF generator 72 and the impedance match network 74 in order to control the application of RF power to the upper electrode 70. The design and implementation of an upper electrode is well known to those skilled in the art.

Figure 5:
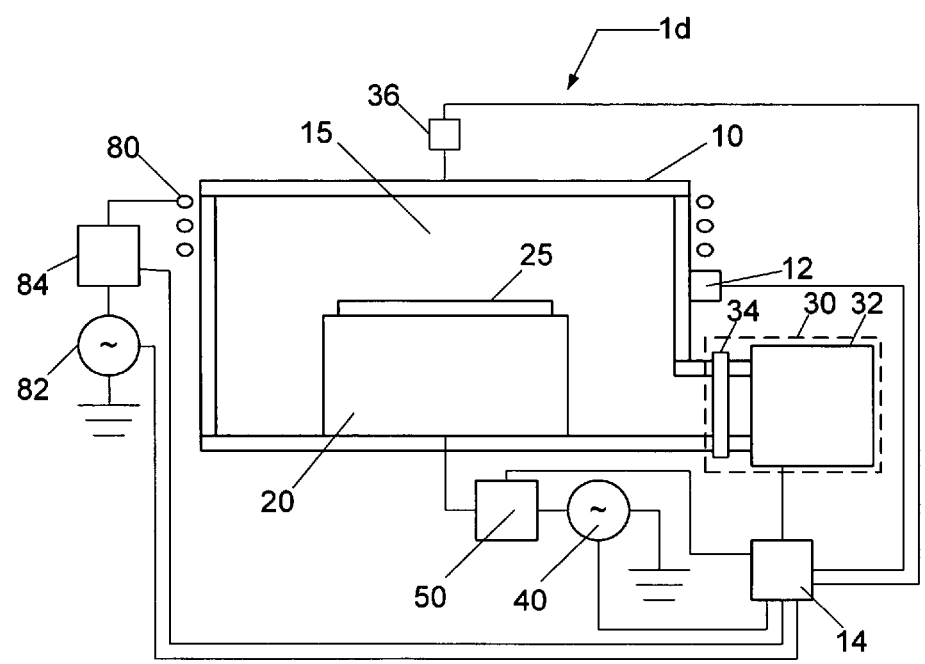
FIG. 5 is a schematic diagram of a plasma processing system according to a further embodiment of the invention.

In the embodiment shown in FIG. 5, a plasma processing system 1d that may be used to implement the present invention may, for example, be similar to the embodiments of FIGS. 1 and 2, and may further include an inductive coil 80 to which RF power is coupled via a RF generator 82 through an impedance match network 84. RF power is inductively coupled from the inductive coil 80 through dielectric window (not shown) to the plasma processing region 15. A typical frequency for the application of RF power to the inductive coil 80 may range from 10 MHz to 100 MHz. Similarly, a typical frequency for the application of power to the chuck electrode may range from 0.1 MHz to 100 MHz. In addition, a slotted Faraday shield (not shown) may be employed to reduce capacitive coupling between the inductive coil 80 and the plasma. Moreover, the controller 14 is coupled to the RF generator 82 and the impedance match network 84 in order to control the application of power to the inductive coil 80. In an alternate embodiment, the inductive coil 80 may be a "spiral" coil or "pancake" coil in communication with the plasma processing region 15 from above as in a transformer coupled plasma (TCP) reactor. The design and implementation of an inductively coupled plasma (ICP) source, or transformer coupled plasma (TCP) source, is well known to those skilled in the art.

Alternately, the plasma may be formed using electron cyclotron resonance (ECR). In yet another embodiment, the plasma may be formed from the launching of a Helicon wave. In yet another embodiment, the plasma may be formed from a propagating surface wave. Each plasma source described above is well known to those skilled in the art.

In an example, a design of experiment (DOE) is performed for an oxide etch process in a plasma processing system, such as the one described in FIG. 2. The parameter ranges include: a RF power of 1400, 1700, and 2000 Watts; a flow rate of $C_4F_8$ of 7, 10, and 13 sccm (standard cubic centimeters per minute); a flow rate of CO of 40, 55, and 70 sccm; a flow rate of $O_2$ of 2.5, 4, and 5.5 sccm; and a pressure of 30, 45, and 60 mTorr.

Figure 6:
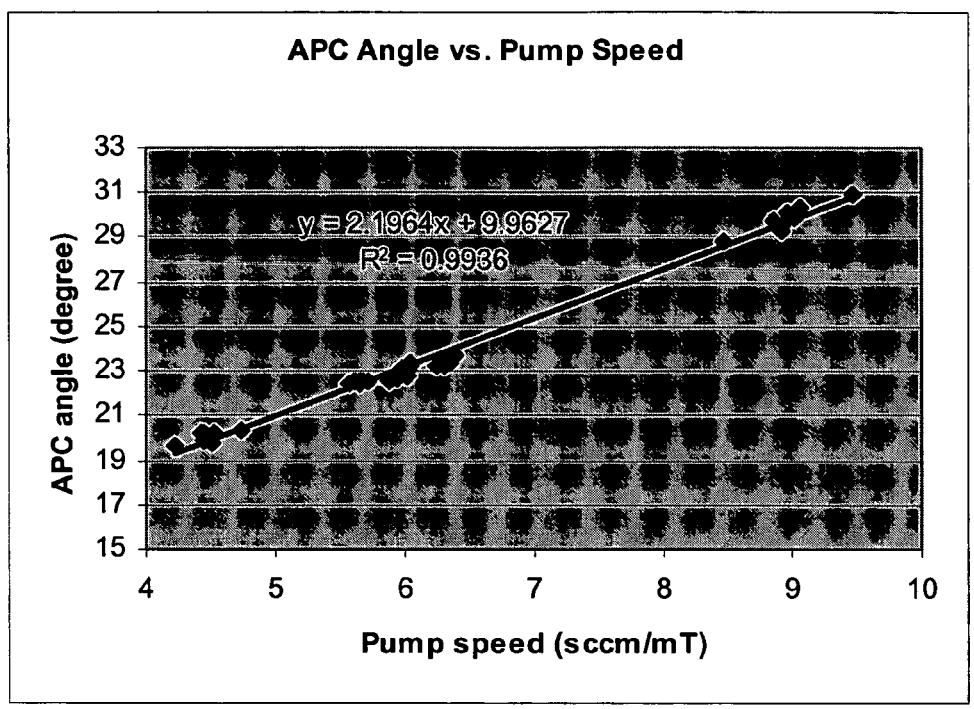
FIG. 6 presents an exemplary set of data representing a valve angle as a function of flow throughput.

In this example, the speed of the pumping system is maintained constant, and the flow rate of inert gas (argon) is maintained constant (i.e., 300 sccm). As shown in FIG. 6, the valve angle of a valve in the pressure control system varies with the effective pumping speed delivered to the process space, and may be represented by the linear expression: $A=kQ/P+b$, wherein A represents valve angle, Q represents throughput (Torr-Liter/Second), P represents pressure (Torr), $S=Q/P$ represents the pumping speed, and k, b are constants. Inspection of FIG. 6 indicates that k is approximately 2.2 and b is approximately 9.9. Therefore, a change in the valve angle translates into a change in the throughput through the plasma processing system, i.e., $\Delta Q=\Delta AP/k$. Alternatively, the valve angle may be represented by an expression of the form $A=kQ/P+b+f(RF\ hours)$, wherein $f(RF\ hours)$ represents an accounting of the accumulation of residue (over time from, for example, substrate to substrate, lot to lot, or number of RF hours) on interior surfaces of the plasma processing system, including the valve, and its effect on the effective pumping speed. The changes in the valve angle, arising, for example, from maintaining a constant pressure, are indicative of changes in the introduction of process gas(es) to the plasma processing system as well as changes in surface chemistry at the substrate and interior surfaces of the process chamber. These changes in the throughput can be utilized to determine a fault condition in the plasma processing system.

Figure 7:
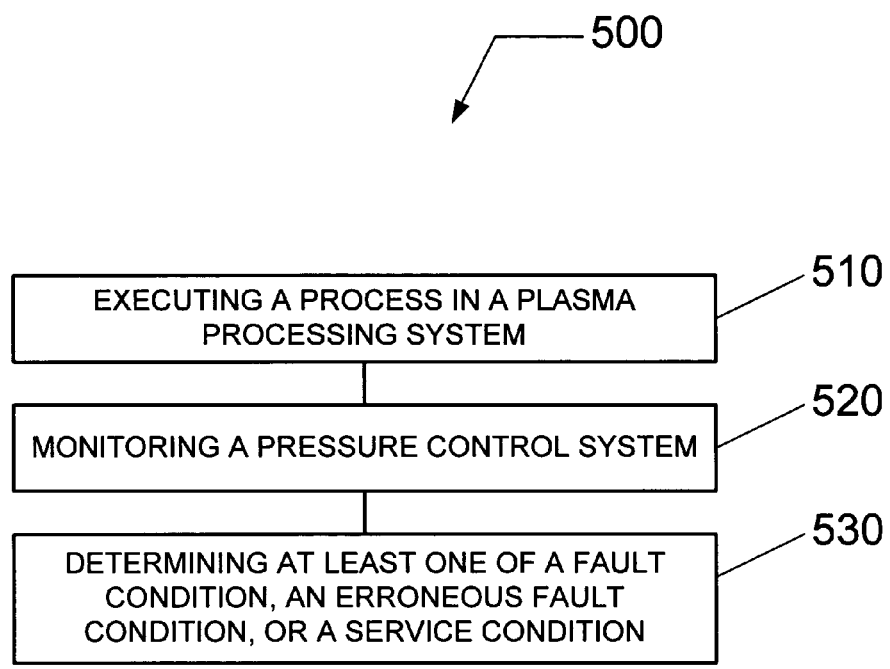
FIG. 7 illustrates a method of monitoring a plasma processing system according to another embodiment of the invention.

According to an embodiment of the invention, at least one of a fault condition, an erroneous fault condition, or a service condition is determined for the plasma processing system by monitoring the pressure control system. For example, FIG. 7 illustrates an exemplary method for monitoring the status of a plasma process system, such as one of the systems depicted in FIGS. 1 through 5. The method includes a flow chart 500 beginning at step 510 with executing a process in the plasma processing system. The process may include, for example, an etch process, or a deposition process.

In step 520, the pressure control system, coupled to the plasma processing system, is monitored. In one embodiment, a position of a valve is monitored. The position of the valve may include a linear position, or an angular position. For example, changes in the linear position or angular position (valve angle) of the valve may indicate changes in the pressure control system. At least one of the valve positions, or the rate of change of the valve position may be monitored. Alternatively, the speed of a pumping system may be monitored.

In step 530, at least one of a fault condition, an erroneous fault condition, or a service condition is determined from monitoring the pressure control system. The determination of an erroneous fault condition includes monitoring a first parameter associated with the pressure control system, and correlating an insubstantial change in the first parameter with a substantial change in a second parameter associated with a gas injection system coupled to the plasma processing system and configured to introduce a process gas to the plasma processing system. The determination of a service condition includes monitoring a parameter associated with the pressure control system and correlating a substantially gradual change in the parameter with an accumulation of residue on an interior surface of the plasma processing system.

In one example, a position of a valve is monitored during the execution of a process in the plasma processing system. The position of the valve includes a valve angle, wherein variation in the pressure of the process associated with a variation in the flow rate through a mass flow controller coupled to the gas injection system causes a change in the valve angle. When the change in the valve angle during the execution of a process on a substrate exceeds a pre-determined threshold value, an operator of the plasma processing system may be alerted to the occurrence of a fault condition associated with the variation in the mass flow controller. For instance, the threshold value may include an absolute value (known to be always greater than or less than the typical range of values for the valve angle), an upper control limit and lower limit set at a fraction (i.e., 20%) of the mean valve angle during processing, or an upper control limit and a lower control limit set at an integer number (i.e., 3) of root mean square (rms) values of the fluctuation of the valve angle during processing.

In another example, a position of the valve is monitored during the execution of a process on the substrate in the plasma processing system. During the process, the valve position indicates no abrupt change in position; however, a mass flow controller reports a sudden change in mass flow rate. Based upon this data, an operator may identify the change reported from the mass flow controller as an erroneous fault condition, and continue to process substrates in the plasma processing system. Alternatively, the operator may identify the change reported from the mass flow controller as an erroneous fault condition, and discontinue to process substrates in the plasma processing system in order to investigate the mass flow controller.

In yet another example, a position of the valve is monitored during the sequential execution of a plurality of substrates through a process in the plasma processing system. During the processing of each substrate, the position, such as a (temporal) mean position, of the valve is monitored as a function of substrate number, lot number, or radio frequency (RF) hours in the plasma processing system. When the position, change in position, or rate of change in the position of the valve becomes greater than (or less than) a pre-determined value, an operator may be notified of a service condition. The service condition may include, for instance, cleaning the plasma processing system in order to remove residue accumulated on the internal surfaces of the plasma processing system.

In yet another example, a position of the valve is monitored during the formation of a plasma in the plasma processing system. When a plasma is formed, (reactant) process gases are consumed and product gases are generated, the gas temperature increases, and gas deposition occurs at surfaces of the plasma processing system. The cumulative affect of these chemical processes are observed in changes in the gas balance (or throughput) and, hence, within the valve angle as the plasma is formed. Abnormalities in the transition between the non-existence of a plasma in the plasma processing system to the existence of a plasma can indicate the occurrence of a fault condition. For example, when the change in the valve position, or angle, is greater than or less than a pre-determined threshold, an operator may be notified of the occurrence of a fault condition during the formation the plasma.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of determining a status for a plasma processing system comprising:
   executing a process in said plasma processing system;
   monitoring a pressure control system, coupled to said plasma processing system, configured to control the pressure of said process in said plasma processing system; and
   determining at least one of a fault condition, an erroneous fault condition, or a service condition for said plasma processing system from said monitoring,
   wherein said determining said erroneous fault condition includes monitoring a first parameter associated with said pressure control system, and correlating an insubstantial change in said first parameter with a substantial change in a second parameter associated with a gas injection system coupled to said plasma processing system and configured to introduce a process gas to said plasma processing system,
   wherein said first parameter includes a position of a valve, a change in said position of said valve, or a rate of change in said position of said valve, or any combination of two or more thereof,
   wherein said second parameter includes a flow rate of said process gas into said plasma processing system, a change of said flow rate, or a rate of change of said flow rate, or any combination of two or more thereof,
   wherein said insubstantial change in said first parameter is determined by setting a threshold for an acceptable change to said first parameter and observing a monitored change in said first parameter that is less than said threshold for acceptable change to said first parameter, and
   wherein said substantial change in said second parameter is determined by setting a threshold for an acceptable change to said second parameter and observing a monitored change in said second parameter that is greater than said threshold for acceptable change to said second parameter.

2. The method of claim 1, wherein said monitoring said position of said valve includes monitoring a valve angle of said valve.

3. The method of claim 2, wherein said process comprises an etch process.

4. The method of claim 2, wherein said valve is selected from a group comprising a gate valve, a swing gate valve, and a butterfly valve.

5. The method of claim 2, wherein determining said fault condition occurs when at least one of said change in said position of said valve or said rate of change of said position of said valve exceeds a pre-determined threshold.

6. The method of claim 2, wherein said monitoring said pressure control system includes monitoring a pumping system.

7. A plasma processing system comprising:
   a process chamber;
   a plasma source coupled to said process chamber and configured to form a plasma in said process chamber from a process gas;
   a substrate holder disposed within said process chamber and configured to support a substrate;
   a gas injection system coupled to said process chamber and configured to introduce said process gas;
   a pressure control system coupled to said process chamber and configured to control a pressure in said process chamber; and
   a controller coupled to said plasma processing system and configured to monitor said pressure control system and determine at least one of a fault condition, an erroneous fault condition, or a service condition for said plasma processing system, wherein said controller monitors a position of a valve and a valve angle of said valve, and
   wherein said controller is configured to determine said erroneous fault condition by monitoring a first parameter associated with said pressure control system, and correlating an insubstantial change in said first parameter with a substantial change in a second parameter associated with said gas injection system, wherein said first parameter includes said position of said valve, said valve angle of said valve, a change in said position of said valve, a change in said valve angle of said valve, a rate of change in said position of said valve, or a rate of change in said valve angle of said valve, or any combination of two or more thereof, wherein said second parameter includes a flow rate of said process gas into said plasma processing system, a change of said flow rate, or a rate of change of said flow rate, or any combination of two or more thereof, wherein said insubstantial change in said first parameter is determined by setting a threshold for an acceptable change to said first parameter and observing a monitored change in said first parameter that is less than said threshold for acceptable change to said first parameter, and wherein said substantial change in said second parameter is determined by setting a threshold for an acceptable change to said second parameter and observing a monitored change in said second parameter that is greater than said threshold for acceptable change to said second parameter.

8. The plasma processing system of claim 7, wherein said valve is selected from a group comprising a gate valve, a swing gate valve, and a butterfly valve.

9. The plasma processing system of claim 7, wherein said fault condition occurs when at least one of said change in said position of said valve, said change in said valve angle of said valve, said rate of change in said valve angle of said valve, or said rate of change of said position of said valve exceeds a pre-determined threshold.

* * * * *